United States Patent [19]

Nakao

[11] Patent Number: 5,767,748
[45] Date of Patent: Jun. 16, 1998

[54] VOLTAGE CONTROLLED OSCILLATOR AND VOLTAGE CONTROLLED DELAY CIRCUIT

[75] Inventor: Takehiko Nakao, Yokohama, Japan

[73] Assignee: Kabushiki Kaisha Toshiba, Tokyo, Japan

[21] Appl. No.: 796,621

[22] Filed: Feb. 7, 1997

[30] Foreign Application Priority Data

Feb. 8, 1996 [JP] Japan .................................. 8-022852

[51] Int. Cl.$^6$ .................................................. H03B 5/00
[52] U.S. Cl. .................................... 331/57; 331/177 R
[58] Field of Search ............................ 331/57, 177 R, 331/DIG. 2, 8

[56] References Cited

U.S. PATENT DOCUMENTS

| | | | |
|---|---|---|---|
| 5,442,325 | 8/1995 | Bosshart | 331/57 |
| 5,495,207 | 2/1996 | Novof | 331/57 |
| 5,502,418 | 3/1996 | Arai | 331/177 R |
| 5,563,554 | 10/1996 | Mizuno | 331/57 |

*Primary Examiner*—Son T. Dinh
*Attorney, Agent, or Firm*—Loeb & Loeb LLP

[57] ABSTRACT

A voltage controlled oscillator is capable of rectilinearly changing an oscillation frequency over a wide range while keeping, to a fixed value, a signal amplitude of a ring oscillator using an differential amplifier by eliminating dependency of the signal amplitude upon a tail current. A load resistor section of each delay element is constructed of a variable resistor element for changing a differential output current flowing corresponding to variations in tail current, and a clamp circuit for fixing the amplitude of an output terminal of the delay element. A control voltage for changing the current of the former part is generated by the replica circuit of the delay element that is equivalent to an arrangement that the part, for fixing the amplitude of the output terminal of the delay element, of the load resistor of the delay element, is removed, and by a control circuit for equalizing a reference voltage for determining the amplitude of the output terminal of the delay element to an output voltage of the replica circuit.

17 Claims, 6 Drawing Sheets

VOLTAGE CONTROLLED OSCILLATOR AND VOLTAGE CONTROLLED DELAY CIRCUIT

BACKGROUND OF THE INVENTION

1. Field of the Invention

The present invention relates generally to a voltage controlled oscillator and more particularly to an improvement of the voltage controlled oscillator constituting a ring oscillator by use of a differential amplifier circuit. The present invention further relates to a voltage controlled delay circuit with a principal construction common to the voltage controlled oscillator.

2. Related Background Art

In recent years, as data communications have increasingly speeded up and augmented capacities, and as a microprocessor also has increased in terms of its operating speed, a synchronous circuit as represented by PLL (Phase Locked Loop) has been also required to operate at a high frequency. Elements indispensable for actualizing such a synchronous circuit are a voltage controlled oscillator (VCO) oscillating and operating in a high frequency band and a voltage controlled delay line (delay circuit) as well.

When actualizing VCO by a CMOS process having a superiority in terms of requiring a small amount of electric power consumption, in the great majority of cases, there is taken a so-called ring oscillator configuration in which unit delay elements such as inverters, etc. are series-connected in a ring shape. The ring oscillator is, however, easily influenced by fluctuations in power supply voltage, temperature and process, and is as a result unusable as a product unless a broad oscillation range is secured. Another problem is that a jitter in output signals is large.

For obviating this problem, a differential ring oscillator with a differential amplifier serving as a delay element has been highlighted in recent years as VCO in the high frequency band. Supposing that the differential amplifier is used as the delay element, a delay time for one stage of the delay element is proportional to:

$$CL \times Vs/I0 \qquad (1)$$

where I0 is the tail current, CL and Vs are the load capacitance and the amplitude at the delay element output, respectively.

Accordingly, a basic method of controlling an oscillating frequency involves adjusting the oscillating frequency by controlling the tail current I0. The tail current I0 is normally generated based on a constant-current circuit, and hence a degree of dependency upon the power supply voltage is low. Further, an operation range of the output of the differential amplifier is defined, and therefore the amplitude Vs is not given corresponding to the power supply voltage but is restrained small. This makes it feasible to oscillate in the high frequency band. Moreover, even if noises are overlapped with the output of the differential amplifier because of fluctuations in the power supply voltage, since the differential amplifier bears equi-phase noise eliminating action, an influence by the noises can be restrained.

Thus, the differential ring oscillator has two merits of being the small amplitude operation and being capable of eliminating the noises. For obtaining an oscillation characteristic (an oscillation frequency versus the controlled voltage) exhibiting a good linearity with respect to the controlled voltage for controlling the oscillation frequency, however, it can be recognized from the formula (1) that the amplitude Vs is required to be kept constant in addition to making the tail current I0 change in a linear form.

A method of keeping the amplitude Vs constant in the prior art differential ring oscillator will be explained with reference to FIGS. 6A, 6B and 7.

Figure 6A:
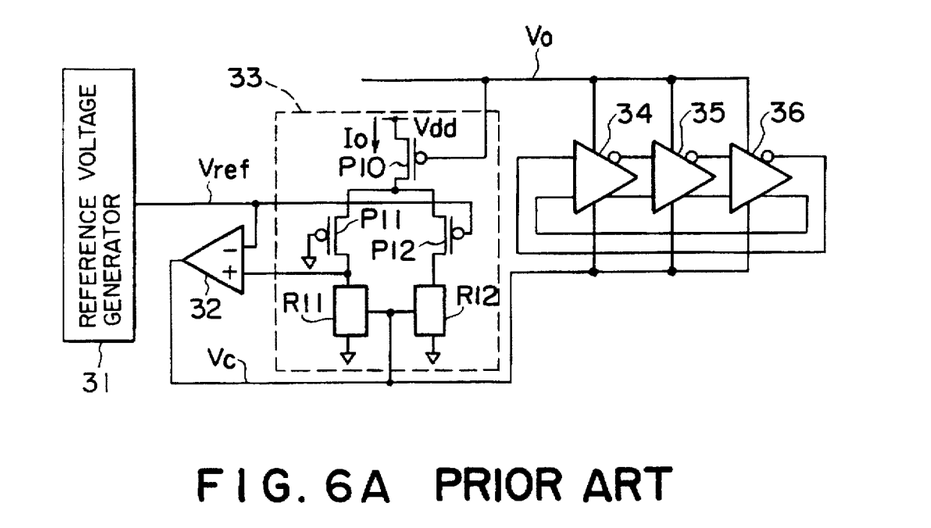
FIG. 6A is a block circuit diagram showing a constructive example of a prior art voltage controlled oscillator.

FIG. 6A illustrates the differential ring oscillator and a circuit peripheral thereto. Referring to FIG. 6A, delay elements 34–36 consisting of differential amplifiers constitute a three-stage ring oscillator.

Figure 6B:
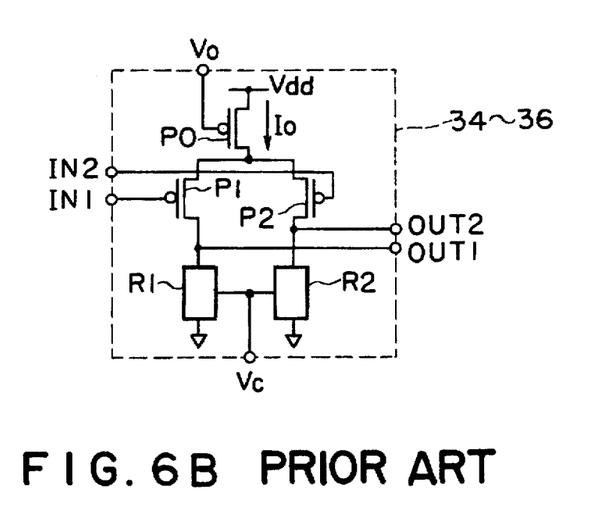
FIG. 6B is a circuit diagram showing construction of a delay element used in the embodiment shown in FIG. 5A.

FIG. 6B shows configurations of circuits of the respective delay elements 34–36. Upon receiving a signal V0 for controlling the tail current I0, a PMOS transistor P0 operates, and the input signals IN1, IN2 are inputted to gates of PMOS transistors P1, P2. These two PMOS transistors P1, P2 are connected respectively to voltage control resistors R1, R2 serving as load resistance elements, with their resistance values changed by a controlled voltage Vc.

Figure 7:
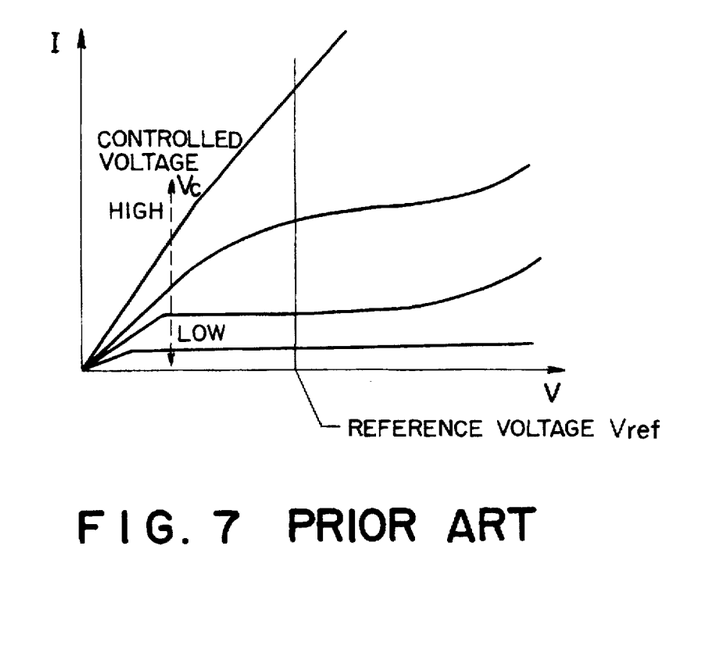
FIG. 7 is a characteristic diagram showing a voltage-versus-current characteristic of a load resistor in a delay element according to the prior art.

FIG. 7 shows a voltage-versus-current characteristic of the voltage control resistor. Referring to FIG. 7, the axis of abscissa indicates a voltage applied across both terminals, while the axis of coordinate indicates an electric current flowing therethrough, wherein the controlled voltage is a parameter. As obvious from FIG. 6, the voltage control resistors R1 and R2 are, if the voltage applied across the both terminals thereof is fixed, capable of supplying a larger current as the controlled voltage Vc becomes higher, i.e., the resistance decreases. The voltage control resistor having such a characteristic is used as a load resistor of the differential amplifier in the delay elements shown in FIG. 5B.

Back to the FIG. 6A, a reference voltage generating circuit 31, an operational amplifier 2, a replica circuit 33 work to uniformize maximum values of the voltages applied across the both terminals of the voltage control resistors R1, R2 of the delay elements 34–36, i.e., uniformize amplitudes of the output terminals of the delay elements.

The replica circuit 33 is a replica (having identical construction) of the delay elements 34–36, and the differential amplifier consisting of transistors P10–P12 and resistors R11, R12 exhibit the same characteristic as that of the differential amplifier of the delay elements 34–36. A low-level voltage is always applied across one of two input terminals of the differential amplifier of this circuit. The transistor P11 completely becomes active, and all the tail current I0 of the current source transistor P10 flows to one branch R11 of the differential amplifier. This is a case where the maximum value of the output voltage of the delay element is obtained, and is a replicated state where all the tail current flows to one input side. Accordingly, the PMOS transistor P11 within the replica circuit 33 of the delay elements is completely set in an ON-state, and, for this purpose, the gate thereof is connected to GND.

This state corresponds to a case where if all the current runs to one input side of the delay element, no current flows to the other input side; therefore an output level thereof becomes a GND level; and this is received by the delay element of the next stage.

A drain (output terminal) of the PMOS transistor P11 through which all the tail current flows, is connected to a positive-phase input terminal of the OP amplifier 32. Applied to another negative-phase of the OP amplifier 32 is a reference voltage Vref generated by the reference voltage generating circuit 31. A difference voltage output of the OP amplifier 32 is applied as a controlled voltage to the voltage control resistors R11, R12. As a result, the OP amplifier 32 controls the output voltage of the replica circuit 33 so as to be equal to the reference voltage Vref. An output of the OP amplifier 32 is set as a controlled voltage Vc of the voltage control resistors of the delay elements 34-36 that have the same construction as the replica circuit 33.

Accordingly, if all the tail current, whatever tail current it may be, flows to one input of the delay element in each delay circuit, the output voltage of the delay element at that time is equal to the reference voltage Vref. The above-described control system is capable of keeping constant the amplitude of the output terminal of the delay element without depending on the tail current, and hence it can be expected to actualize the voltage controlled oscillator exhibiting a good linearity of the tail current-versus-oscillation-frequency characteristics.

As result of examining the above voltage controlled oscillator in many ways, however, it is recognized that there exists a problem attributed to a non-linearity of the voltage control resistor. For example, when trying to decrease the oscillation frequency, it follows that the controlled voltage Vc applied to the voltage control resistor is also decreased. The voltage control resistor is constructed of a transistor circuit. If the controlled voltage Vc is small, however, as shown in FIG. 6, a voltage-versus-current characteristic of the transistor is a characteristic of being liable to immediately saturate, and it may happen that the tail current flows before the voltages at the both terminals of the voltage control resistor reach the reference voltage Vref.

This implies that the output of the delay element oscillates with a smaller amplitude than a predetermined value, and an amplitude Vs of the output of the delay element depends upon the tail current I0. Thus, with the amplitude Vs depending on the tail current I0, as can be understood from the formula (1), there is deteriorated the linearity of the oscillation characteristic of the voltage controlled oscillator for controlling the delay by the tail current I0. Further, when the amplitude becomes small, a gain per stage of delay element decreases, and consequently there rises such a situation that the oscillation can not be effected.

SUMMARY OF THE INVENTION

Accordingly, it is an object of the present invention to provide a voltage controlled oscillator capable of keeping constant an amplitude of an output signal of a delay element without being influenced by a tail current, and causing rectilinear variations in oscillation frequency over a broad range.

It is another object of the present invention to provide an improved voltage control delay circuit with the same kind of construction as the above voltage controlled oscillator.

According to one aspect of the present invention, there is provided a voltage controlled oscillator comprising:

- a ring oscillator for determining a oscillation frequency in response to a control voltage, which forms a feedback loop by a plurality of delay elements each including a differential amplifier and a first load resistor section having a first variable resistor whose resistance varies in response to said control voltage and a clamp circuit for clamping a level at an output terminal of said first variable resistor to a predetermined value;
- a replica circuit including a second load resistor section having a second variable resistor whose resistance varies in response to said control voltage, said second load resistor section having similar circuit construction to that of said first resistor section; and
- a control circuit for generating a load resistance control voltage for making an output voltage of said replica circuit coincident with a reference voltage for setting an oscillation amplitude, and supplying the control voltage to said replica circuit and said load resistor sections.

According to this arrangement, a load resistor of a delay element is composed of two parts. One is a part for changing an electric current (i.e., a variable resistor) flowing corresponding to variations in tail current, and the other is a clamp circuit for fixing an amplitude of an output terminal of the delay element. A control voltage for changing the former current is generated by a replica circuit of the delay element, with the part for fixing the amplitude of the output terminal of the delay element being removed from the load resistor of the delay element, and by a control circuit for equalizing an output voltage of the replica circuit to a reference voltage for determining the amplitude of the output terminal of the delay element.

According the other aspect of the present invention, there is provided a voltage controlled delay circuit comprising:

- a signal delay circuit for delaying signal flowing therethrough in response to a control voltage, which is formed by a plurality of series connected delay elements each including a differential amplifier and a first load resistor section having a first variable resistor whose resistance varies in response to said control voltage and a clamp circuit for clamping a level at an output terminal of said first variable resistor to a predetermined value;
- a replica circuit including a second load resistor section having a second variable resistor whose resistance varies in response to said control voltage, said second load resistor section having similar circuit construction to that of said first resistor section; and
- a control circuit for generating a load resistance control voltage for making an output voltage of said replica circuit coincident with a reference voltage for setting an oscillation amplitude, and supplying the control voltage to said replica circuit and said load resistor sections.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

A first embodiment of a voltage controlled oscillator according to the present invention will be described with reference to FIGS. 1A, 1B and 2.

Figure 1A:
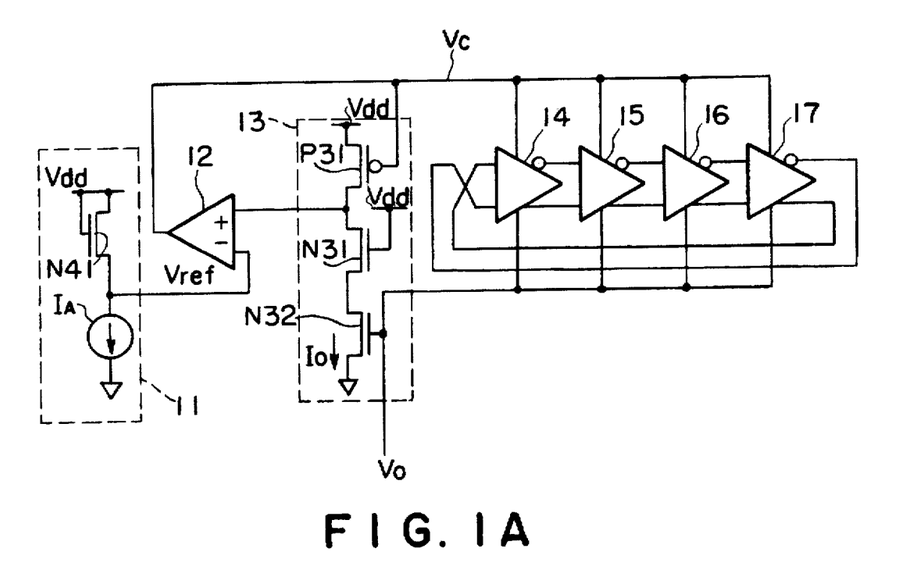
FIG. 1A is a block circuit diagram showing a voltage controlled oscillator of an embodiment of the present invention.

Referring to FIG. 1A, there are shown a reference voltage generating circuit 11, an OP amplifier 12, a replica circuit 13, and delay elements 14–17 connected in loop. In this embodiment, the delay elements based on a differential amplifier are connected at four stages, thereby constituting a differential ring oscillator.

Figure 1B:
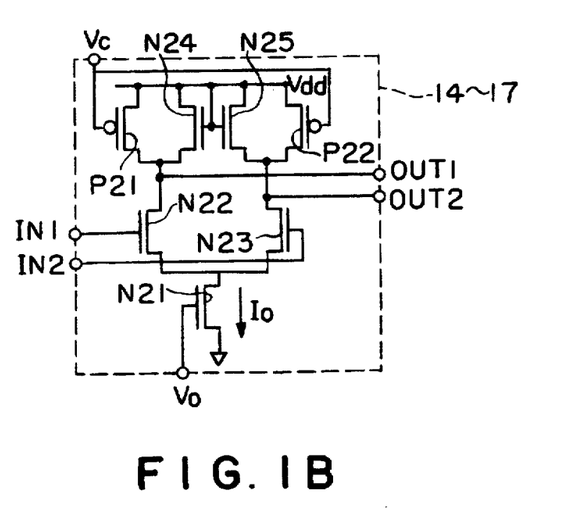
FIG. 1B is a circuit diagram showing construction of a delay element used in the embodiment shown in FIG. 1A.

FIG. 1B illustrates an constructive example of the delay elements. The delay element is constructed of a current source NMOS transistor N21, an NMOS differential transistor pair N22 and N23, a first resistance load circuit serving as a load of the transistor N22, and a second resistance load circuit serving as a load of the transistor N23. The first resistance load circuit is connected in between a power supply Vdd and a drain of the transistor N22. The first resistance load circuit is constructed of a PMOS transistor P21 with a gate to which the controlled voltage Vc is applied, and a transistor N24 with a drain and a gate that are connected to the power supply Vdd, and with a source connected to the drain of the transistor N22. Herein, the transistor P21 controls the current flowing through the load circuit in accordance with the controlled voltage Vc serving as a load resistance controlled voltage. The diode-connected transistor N24 sets a signal amplitude of an output terminals OUT1 defined as a source (a drain of the transistor N22) of the transistor N24. The second resistance load circuit is connected to the power supply Vdd and a drain of the transistor N23. The second resistance load circuit is constructed of a PMOS transistor P22 with a gate to which the controlled voltage Vc is applied, and a transistor N25 with a drain and a gate that are connected to the power supply Vdd, and with a source connected to the drain of the transistor N23. The transistor P22 controls the current flowing through the load circuit in accordance with the controlled voltage. The diode-connected transistor N25 sets a signal amplitude of an output terminals OUT2 defined as a source (a drain of the transistor N23) of the transistor N25.

The thus constructed voltage controlled oscillator also changes an oscillation frequency by causing variations in tail current I0 with a controlled voltage V0. On this occasion, however, a gate voltage Vc of the PMOS transistors P21, P22 of the load resistor of the delay element, is controlled. This gate voltage Vc is obtained by the reference voltage generating circuit 11, the OP amplifier 12 and the replica circuit 13.

The reference voltage generating circuit 11 is constructed of a diode-connected NMOS transistor N41 with a drain and a gate that are connected to the power supply Vdd, and a constant-current source IA. A reference voltage Vref, i.e., an output of the reference voltage generating circuit 11 becomes a voltage slightly lower than an NMOS threshold voltage Vthn from Vdd.

The replica circuit 13 is constructed of one circuit of symmetrically-disposed circuits of the delay element, and there is reproduced a case where all the tail current I0 flows to one-side of the delay element. That is, the replica circuit 13 is constructed of PMOS transistors P31, N31 and N32 that correspond to the transistors P21, N22 and N21. However, the NMOS transistor N24 of the load resistor is removed therefrom.

Further, the PMOS transistor of the load resistor of the delay element is formed smaller so that a ratio of a channel width W of the PMOS transistor P31 in the replica circuit 13 to a channel width W of the PMOS transistors P21, P22 of the load resistor in the delay element, is, e.g., 1:0.8. This ratio can be determined by a circuit simulation to obtain a desired voltage-versus-current characteristic (FIG. 2) of the load resistor that will be mentioned later on.

A control system of the reference voltage generating circuit 11, the OP amplifier 12 and the replica circuit 13 controls the output voltage of the replica circuit 13 for flowing the same current as the tail current I0 so that the above output voltage is equal to the reference voltage Vref. Herein, to put an emphasis on the delay element, when an output OUT1 (or OUT2) of a delay element 14 reaches the reference voltage Vref, 80% of the tail current I0 flows through the transistor P21 (or P22). The reason for this is, as described above, that the ratio of the channel widths W of the PMOS transistors P21, P22 of the load resistor in the delay element is set to 1:0.8. Hence, when all the tail current flows to the one-side circuit of the delay element, 20% of the tail current runs to the NMOS transistor N24 (or N25) of the load resistor, thereby operating it. Existences of the NMOS transistors N24, N25 of this load resistor play an important role in terms of keeping the amplitude of the output terminal of the delay element to the fixed value Vthn (the threshold value of the NMOS transistor).

Figure 2:
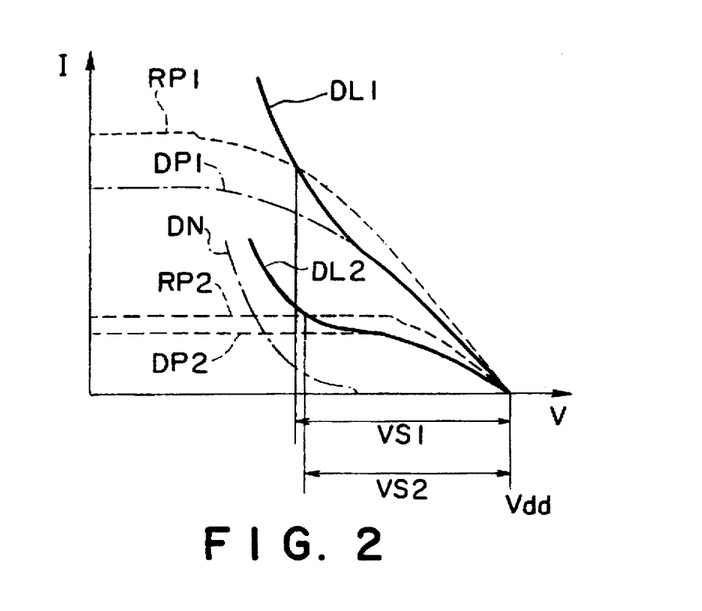
FIG. 2 is a characteristic diagram showing a voltage-versus-current characteristic of a load resistor of a delay element in the embodiment shown in FIG. 1A.

FIG. 2 shows a voltage-versus-current characteristic of the load resistor of the delay element shown in FIG. 1.

To begin with, a case of the tail current I0 being large will be explained. The reference voltage Vref in FIG. 1 exhibits, since the drain and the gate of the NMOS transistor N41 in the reference voltage generating circuit 11 are connected to the power supply Vdd, the same voltage-versus-current characteristic as the voltage-versus-current characteristic (DN in FIG. 2) of the NMOS transistor of the load resistor, if the channel width W thereof is equalized to the channel width W of the NMOS transistors N24, N25 within the load resistor of the delay element. The NMOS transistor has a steeper rising characteristic than the PMOS transistor. Hence, the reference voltage Vref is given at such a point that the characteristic DN in FIG. 2 causes a flow of the current of the constant-current source IA of the reference voltage generating circuit 11 in FIG. 1. The PMOS transistor P31 of the replica circuit 13 is controlled so that the tail current I0 flows when the reference voltage Vref is applied across between the drain and the source, and therefore has a voltage-versus-current characteristic shown by RP1 in FIG. 2.

On the other hand, the voltage-versus-current characteristic of the PMOS transistors P21, P22 of the load resistor of the delay element goes as shown by DP1 in FIG. 2, because only an 80% current of that of the PMOS transistor P31 of the replica circuit 13 flows. A characteristic DL1 into which that characteristic DP1 is combined with the characteristic DN defined as a characteristic of the NMOS transistor, is a voltage-versus-current characteristic of the whole load resistor of the delay element. Then, a lower limit of the output voltage of the delay element, i.e., an output voltage Vs1 of the delay element when all the tail current flows to one-side of the delay element, is given substantially at a cross point between a curve RP1 and a curve DL1. An upper limit of the output voltage of the delay element, because of a time when no current flows to the one-side of the delay element, is given at a cross point (Vdd) between DL1 and a V-axis. Accordingly, a range indicated by Vs1 corresponds to an amplitude of the output of the delay element when the tail current is large.

Given next is an explanation of a case where the tail current I0 is small. The voltage-versus-current characteristic of the PMOS transistor P31 of the replica circuit 13 goes as indicated by a characteristic curve RP2 in FIG. 2 because of the current being small to be flowed. Then, the voltage-versus-current characteristic of the PMOS transistors P21, P22 of the load resistor goes as indicated by a characteristic curve DP2 because of 80% current of RP2 being flowed. A characteristic DL2 into which this characteristic DP2 is combined with the characteristic DN of the NMOS transistor of the load resistor, becomes a voltage-versus-current characteristic of the whole load resistor of the delay element when the tail current is small. A lower limit of the output voltage of the delay element in this case is given at a cross point between RP2 and DL2, and therefore a range shown by Vs2 corresponds to an amplitude of the output of the delay element.

When comparing the amplitude Vs1 in the case of the tail current I0 being large with the amplitude Vs2 in the case of the tail current I0 being small, it can be known that the amplitude substantially does not depend on a magnitude of the tail current I0.

Thus, the amplitude can be kept substantially constant when the tail current is small, and even if a saturation area appears in the voltage-versus-current characteristic of the load resistor of the delay element. The reason for this is that the reference voltage generating circuit 11 for determining the amplitude sets the NMOS transistor operating in the same manner as the NMOS transistor N41 for determining the reference voltage so that the necessary current can not be obtained unless the NMOS transistors (N24, N25) included in the load resistor of the delay element is operated.

Figure 3A:
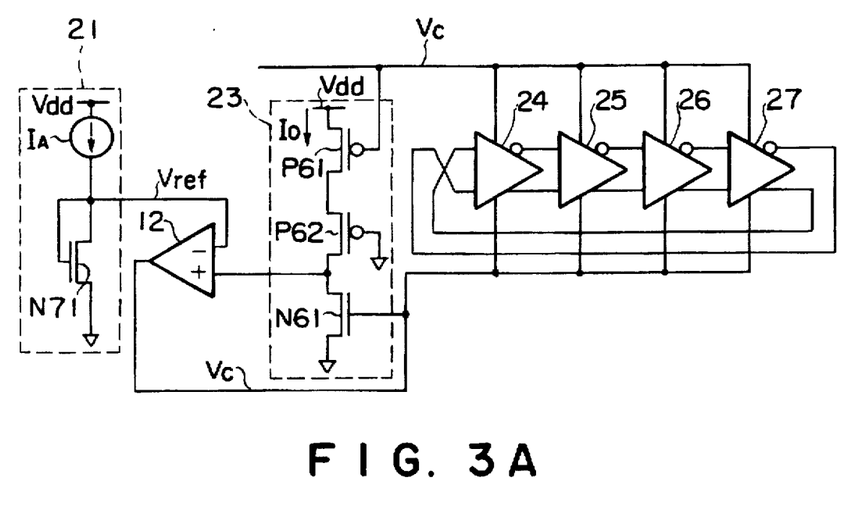
FIG. 3A is a block circuit diagram showing another embodiment of the voltage controlled oscillator according to the present invention.
Figure 3B:
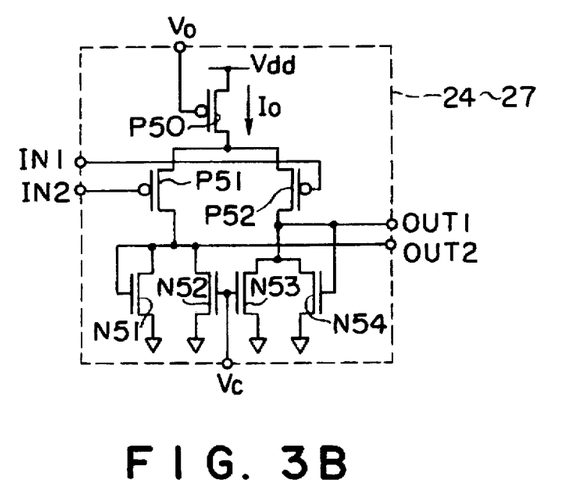
FIG. 3B is a circuit diagram showing construction of a delay element used in the embodiment shown in FIG. 3A.

Next, FIGS. 3A and 3B show another embodiment of the present invention. A construction in this embodiment is based on transistors having polarity opposite to that in the embodiment illustrated in FIG. 1A. The components corresponding to those of the voltage controlled oscillator circuit illustrated in FIG. 1 are marked with the same numerals in FIG. 3.

FIG. 3B shows details of configurations of the delay elements 24–27 shown in FIG. 3A. In this embodiment, the tail current I0 runs through the PMOS transistor. A current quantity is controlled by a controlled voltage V0. The way in which a resistance value of the load resistor of the delay element is controlled in combination with a change in the tail current, is the same in the embodiment shown in FIG. 1. A signal Vc works to control the resistance value of the load resistor. The controlled voltage Vc is generated by using the reference voltage Vref generated by the reference voltage generating circuit 21, an OP amplifier 22, and a replica circuit 23, wherein a NMOS transistor N51 (or N54), with the drain and gate connected, of the load resistor is removed, of one-side circuits of the delay element. The reference voltage Vref is determined at such a point that an NMOS transistor N71 in the reference voltage generating circuit 21 is capable of receiving the current supplied from the constant-current source IA. The OP amplifier 22 operates so that the reference voltage Vref is equal to an output voltage of the replica circuit 23 of the delay element. An NMOS transistor N61 of the replica circuit 23 flows the same quantity of current as the tail current I0 flowing through the delay element in a state where the reference voltage Vref is applied across between the drain and the source. Herein, as in the embodiment shown in FIG. 1, if a ratio of a channel width W of an NMOS transistor N61 of the replica circuit 23 to a channel width W of NMOS transistors N52, N53 of the load resistor of the delay element, is set so that the channel width in the load resistor of the delay element is smaller such as, e.g., 1:0.8, only an 80% current of the tail current flows trough the NMOS transistors N52, N53 with the gates controlled by the output Vc of the OP amplifier 22 even when the same voltage as the reference voltage Vref is applied across between the drain ad the source. Hence, the NMOS transistors N51, N54 with the gates short-circuited take charge of the remaining 20% current.

A voltage-versus-current characteristic of the load resistor of each delay element in this embodiment will be explained with reference to FIG. 4.

To start with, a case of the tail current being large will be described. The reference voltage Vref is determined at such a point that an NMOS transistor N71 of the reference voltage generating circuit 21 is capable of receiving the current supplied from the constant-current source IA. The reference voltage Vref is slightly higher than the threshold voltage Vthn of the NMOS transistor. The controlled voltage Vc is controlled so that the same quantity of current as the tail current flows through the NMOS transistor N61 when a voltage equal to the reference voltage Vref is applied across between the drain and the source of the NMOS transistor N61 of the replica circuit 23. Hence, the voltage-versus-current characteristic of the NMOS transistor N61 becomes a characteristic RN1 shown in FIG. 4.

Figure 4:
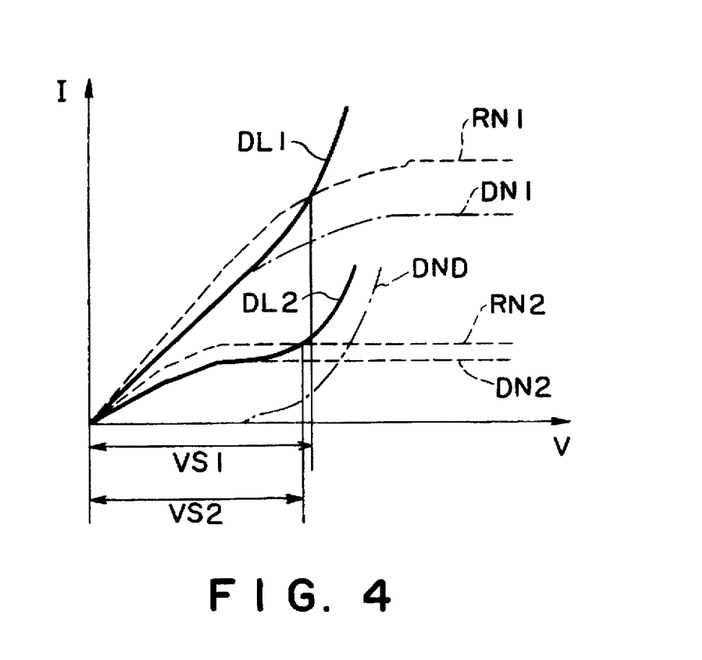
FIG. 4 is a characteristic diagram showing a voltage-versus-current characteristic of the load resistor of the delay element in the embodiment shown in FIG. 3.

On the other hand, the NMOS transistors N52, N53, with the gates controlled by the controlled voltage Vc, of the load resistor of the delay element, can flow only the 80% current of the NMOS transistor N61 of the replica circuit 23, and therefore are possessed of the voltage-versus-current characteristic as indicated by DN1 in FIG. 4. DL1 into which this voltage-versus-current characteristic is combined with a voltage-versus-current characteristic DND of the NMOS transistors N51, N54 with the drains and gates connected, becomes a voltage-versus-current characteristic of the whole load resistor of the delay element. A lower limit of the output voltage of the delay element, i.e., an operating point when all the tail current flows to one-side of the delay element, is thereby substantially equal to a cross point between DL1 and RN1 in FIG. 4. Accordingly, an amplitude of the output terminal of the delay element corresponds to a range indicated by Vs1 in FIG. 4.

Next, a case of the tail current I0 being small will be explained. When the tail current I0 is small, it may suffice that the current flowing to the replica circuit 23 is small. The voltage-versus-current characteristic of the NMOS transistor N61 of the replica circuit 23 therefore becomes a characteristic RN2 in FIG. 4. The voltage-versus-current characteristic of the NMOS transistors N52, N53, with the gates controlled by the controlled voltage Vc, of the load resistor of the delay element, permits only the 80% current of the NMOS transistor N61 of the replica circuit 23 to flow as described above, and therefore becomes DN2 in FIG. 4. DL2 into which this voltage-versus-current characteristic DN2 is combined with the voltage-versus-current characteristic DND of the NMOS transistors N51, N54 with the drains and gates connected, becomes a voltage-versus-current characteristic of the whole load resistor of the delay element. The lower limit of the output voltage of the delay element, i.e., the operating point when all the tail current flows to one-side of the delay element, is thereby substantially equal to a cross point between DL2 and RN2 in FIG. 6. Accordingly, the amplitude of the output terminal of the delay element corresponds to a range indicated by Vs2 in FIG. 4.

Herein, when comparing the amplitude Vs1 f the output of the delay element in the case of the tail current being large with the amplitude Vs2 of the output of the delay element in the case of the tail current being small, it can be understood that the amplitude substantially depend on the tail current.

The reason for this is that as in the embodiment illustrated in FIG. 1A, the reference voltage generating circuit 21 for determining the amplitude sets the NMOS transistor operating in the same manner as the NMOS transistor N71 for determining the reference voltage so that the necessary current can not be obtained unless that NMOS transistor included in the load resistor of the delay element is operated.

Figure 5:
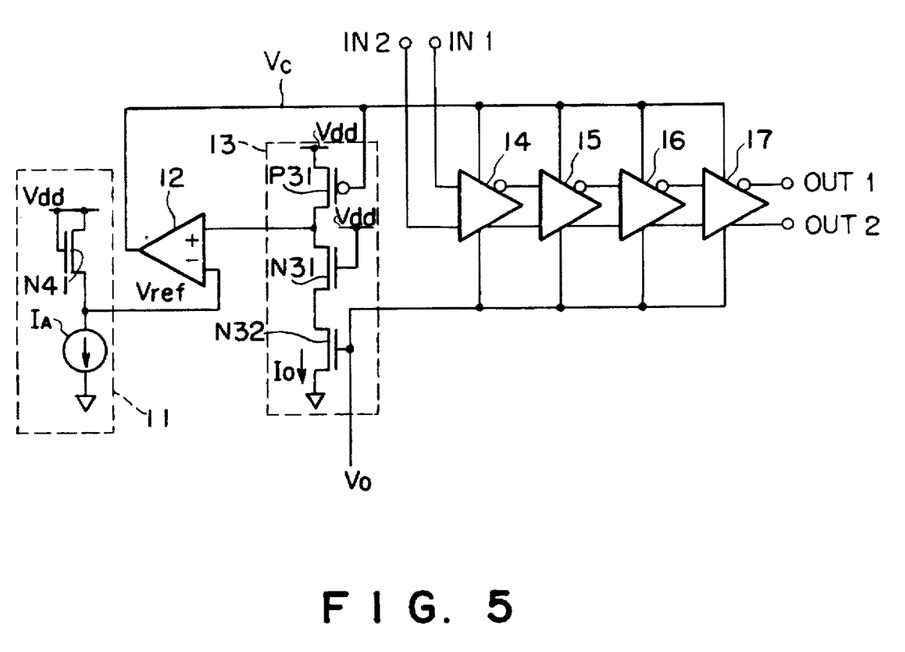
FIG. 5 is a block circuit diagram showing a voltage controlled delay circuit of an embodiment according to the present invention.

Next, a voltage control delay circuit will be described referring to FIG. 5. The circuit shown in FIG. 5 is the same as FIG. 1, except that no feedback loop is formed. That is, a series circuit is provided by opening a loop consisting of the above-mentioned ring oscillators 14–17 or 24–27. The data signals are given to the input terminal of this series circuit, while the data signals are fetched out of the output terminal of the series circuit, whereby this series circuit becomes a voltage control delay circuit with the controlled voltage serving as a delay time control signal. This voltage control delay circuit is also allowed to take over a variety of advantages such as the rectilinear delay time characteristic and the constant signal amplitude of the above voltage controlled oscillator.

Note that the two embodiments discussed above have presented the example where the ring oscillator is constructed of the four delay elements. The present invention is not, however, limited to this construction, and the ring oscillator may be constructed of the delay elements at a required number of stages.

As discussed above, the voltage controlled oscillator of the present invention is capable of keeping substantially constant the amplitude of the output terminal of the delay element even when the oscillation frequency might fluctuate in a wide range, and therefore the oscillation characteristic having the high linearity can be attained. Hence, the oscillation range can be restrained down to the minimum required, and consequently it is feasible to actualize the voltage controlled oscillator that is hard to have an influence by noises. Further, if the tail current is generated based on the constant-current circuit with the current value determined by the same factor as the reference voltage for determining the oscillation amplitude, it is possible to compensate influences by fluctuations in terms of process and temperature as well.

Moreover, the voltage control delay circuit according to the present invention is capable of keeping substantially constant the amplitude of the output terminal of the delay element even when the delay time might fluctuate in the wide range, and the controlled voltage versus delay time characteristic exhibiting the high linearity is therefore attainable.

It is apparent that, in this invention, a wide range of different working modes can be formed based on the invention without deviating from the spirit and scope of the invention. This invention is not restricted by its specific working modes except being limited by the appended claims.

What is claimed is:

1. A voltage controlled oscillator comprising:
   a ring oscillator for determining a oscillation frequency in response to a control voltage, which forms a feedback loop by a plurality of delay elements each including a differential amplifier and a first load resistor section having a first variable resistor whose resistance varies in response to said control voltage and a clamp circuit for clamping a level at an output terminal of said first variable resistor to a predetermined value;
   a replica circuit including a second load resistor section having a second variable resistor whose resistance varies in response to said control voltage, said second load resistor section having similar circuit construction to that of said first resistor section; and
   a control circuit for generating a load resistance control voltage for making an output voltage of said replica circuit coincident with a reference voltage for setting an oscillation amplitude, and supplying the control voltage to said replica circuit and said load resistor sections.

2. The voltage controlled oscillator according to claim 1, wherein said second variable resistor has a lower resistance than that of said first variable resistor at the same control voltage.

3. The voltage controlled oscillator according to claim 1, wherein said first load resistor section and said second load resistor section are provided between said a first power supply voltage and a second power supply voltage.

4. The voltage controlled oscillator according to claim 1, wherein an oscillation frequency of said ring oscillator is determined by setting an output current of a current source of the differential amplifier circuit.

5. The voltage controlled oscillator according to claim 1 wherein said first and second variable resistors are constructed by P channel or N channel MOS transistors and said clamp circuit is constructed by a diode-connected N channel MOS transistor.

6. The voltage controlled oscillator according to claim 4, wherein a current ratio between MOS transistors constituting said first and second variable resistance elements is set such as 1:n (n<1).

7. The voltage controlled oscillator according to claim 1, wherein said voltage controlled oscillator further comprises a voltage generating circuit which includes a series circuit of a diode and a current source and generates said reference voltage and said control voltage to be supplied to said delay elements.

8. The voltage controlled oscillator according to claim 1, wherein said delay element includes:
   first and second transistors with gates each connected to a signal input terminal and with one terminals connected in common to form a differential transistor pair;
   a third transistor, connected between the common connecting point of said differential transistor pair and a first power supply, with the controlled voltage applied to a gate thereof;
   a fourth transistor, with the load resistance controlled voltage applied to a gate thereof, connected between a second power supply and the other terminal of said first transistor;
   a fifth transistor of NMOS, with both one terminal and a gate thereof connected to the second power supply, and with the other terminal connected to the other terminals of said first transistor;
   a sixth transistor, with the load resistance controlled voltage applied to a gate thereof, connected between the second power supply and the other terminal of said second transistor; and
   a seventh transistor of NMOS, with both one terminal and a gate connected to the second power supply, and with the other terminal connected to the other terminal of said second transistor, said replica circuit includes:

eighth transistors, each formed with polarities corresponding to said third, first and fourth transistors, or said third, second and sixth transistors, with the load resistance controlled voltage applied to a gate thereof, connected between the second power supply and the output terminal;

a ninth transistor with a predetermined voltage applied to a gate thereof and with one terminal connected to the output terminal; and a tenth transistor, with the controlled voltage applied to a gate thereof, connected between the other terminal of said ninth transistor and the first power supply.

wherein said fourth, sixth and eighth transistors are formed so that a current ratio of a passage current through said eighth transistor to a passage current through each of said fourth and sixth transistors is set such as 1:n (n<1).

9. A voltage control oscillator comprising:

a ring oscillator for determining an oscillation frequency by forming a feedback loop in which each of a plurality of differential amplifier circuits includes a load resistor containing a voltage-controlled variable resistance, and by setting an output current of each of the power supplies in accordance with the controlled voltage supplied;

a replica circuit having the same circuit configuration as that of said differential amplifier circuit having the load resistor; and a control circuit for generating a load resistance controlled voltage for making an output voltage of said replica circuit coincident with a reference voltage for setting an oscillation amplitude to be supplied, and supplying this load resistance control voltage to said replica circuit and said load resistor of each of said differential amplifiers, said load resistor of said differential amplifier circuit, including:

a fist variable resistance element, provided in between a power supply and an output terminal, with a resistance value varied corresponding to the load resistance controlled voltage; and a clamp circuit for clamping a level of the output terminal to a predetermined value, said load resistor of said replica circuit, including:

a second variable resistance element, provided in between the power supply and the output terminal, with a resistance value varied corresponding to the load resistance control value, wherein said first variable resistance element is formed to have the resistance value larger than that of said second variable resistance element under a supply of the same load resistance controlled voltage.

10. A voltage controlled delay circuit comprising:

a signal delay circuit for delaying signal flowing therethrough in response to a control voltage, which is formed by a plurality of series connected delay elements each including a differential amplifier and a first load resistor section having a first variable resistor whose resistance varies in response to said control voltage and a clamp circuit for clamping a level at an output terminal of said first variable resistor to a predetermined value;

a replica circuit including a second load resistor section having a second variable resistor whose resistance varies in response to said control voltage, said second load resistor section having similar circuit construction to that of said first resistor section; and a control circuit for generating a load resistance control voltage for making an output voltage of said replica circuit coincident with a reference voltage for setting an oscillation amplitude, and supplying the control voltage to said replica circuit and said load resistor sections.

11. The voltage controlled delay circuit according to claim 10, wherein said second variable resistor has a lower resistance than that of said first variable resistor at the same control voltage.

12. The voltage controlled delay circuit according to claim 10, wherein said first load resistor section and said second load resistor section are provided between said a first power supply voltage and a second power supply voltage.

13. The voltage controlled delay circuit according to claim 10, wherein an oscillation frequency of said ring oscillator is determined by setting an output current of a current source of the differential amplifier circuit.

14. The voltage controlled delay circuit according to claim 10, wherein said first and second variable resistors are constructed by P channel or N channel MOS transistors and said clamp circuit is constructed by a diode-connected N channel MOS transistor.

15. The voltage controlled delay circuit according to claim 13, wherein a current ratio between MOS transistors constituting said first and second variable resistance elements is set such as 1:n (n<1).

16. The voltage controlled delay circuit according to claim 10, wherein said voltage controlled oscillator further comprises a voltage generating circuit which includes a series circuit of a diode and a current source and generates said reference voltage and said control voltage to be supplied to said delay elements.

17. The voltage controlled delay circuit according to claim 10, wherein said delay element includes:

first and second transistors with gates each connected to a signal input terminal and with one terminals connected in common to form a differential transistor pair;

a third transistor, connected between the common connecting point of said differential transistor pair and a first power supply, with the controlled voltage applied to a gate thereof;

a fourth transistor, with the load resistance controlled voltage applied to a gate thereof, connected between a second power supply and the other terminal of said first transistor;

a fifth transistor of NMOS, with both one terminal and a gate thereof connected to the second power supply, and with the other terminal connected to the other terminals of said first transistor;

a sixth transistor, with the load resistance controlled voltage applied to a gate thereof, connected between the second power supply and the other terminal of said second transistor; and a seventh transistor of NMOS, with both one terminal and a gate connected to the second power supply, and with the other terminal connected to the other terminal of said second transistor.

said replica circuit includes:
- eighth transistors, each formed with polarities corresponding to said third, first and fourth transistors, or said third, second and sixth transistors, with the load resistance controlled voltage applied to a gate thereof, connected between the second power supply and the output terminal;
- a ninth transistor with a predetermined voltage applied to a gate thereof and with one terminal connected to the output terminal; and
- a tenth transistor, with the controlled voltage applied to a gate thereof, connected between the other terminal of said ninth transistor and the first power supply, wherein said fourth, sixth and eighth transistors are formed so that a current ratio of a passage current through said eighth transistor to a passage current through each of said fourth and sixth transistors is set such as 1:n (n<1).

* * * * *